United States Patent [19]
Bui et al.

[11] Patent Number: 5,126,690
[45] Date of Patent: Jun. 30, 1992

[54] PHASE LOCKED LOOP LOCK DETECTOR INCLUDING LOSS OF LOCK AND GAIN OF LOCK DETECTORS

[75] Inventors: Man M. Bui, Playa del Rey, Calif.; Andrew S. Potemski, Poughkeepsie, N.Y.

[73] Assignee: International Business Machines Corporation, Armonk, N.Y.

[21] Appl. No.: 742,120

[22] Filed: Aug. 8, 1991

[51] Int. Cl.⁵ .................................. H03L 7/095
[52] U.S. Cl. ..................... 331/1 A; 331/25; 331/DIG. 2
[58] Field of Search .................. 331/1 A, 25, DIG. 2

[56] References Cited

U.S. PATENT DOCUMENTS

| | | | |
|---|---|---|---|
| 4,287,480 | 9/1981 | Swift et al. | 331/1 A |
| 4,633,488 | 12/1986 | Shaw | 375/120 |
| 4,745,372 | 5/1988 | Miwa | 331/8 |
| 4,929,916 | 5/1990 | Fukuda | 331/1 A |
| 5,008,635 | 4/1991 | Hanke et al. | 331/1 A |

*Primary Examiner*—Siegfried H. Grimm
*Attorney, Agent, or Firm*—Floyd A. Gonzalez

[57] ABSTRACT

A phase lock detector circuit for detecting the lock state of a phase locked loop (PLL) such that it is known when a synthesized clock has achieved a stable phase relationship with its reference clock signal. The PLL includes an input for receiving the reference signal, a digital phase detector, a voltage controlled oscillator, and a frequency divider. The phase lock detector of the present invention includes a loss of lock detector (LOLD) connected to the frequency divider, the phase detector and the input. The LOLD detects the occurrence of a selected phase difference between the reference signal and an output of the frequency divider for a selected number of cycles. Also included is a gain of lock detector (GOLD) connected to the frequency divider and the input. The GOLD detects the occurrence of the reference signal within a selected phase difference of an output of the frequency divider for a second selected number of cycles. The outputs of the LOLD and the GOLD are connected to a latch for generating a composite signal responsive to signals generated by the LOLD and the GOLD such that the composite signal has a first state indicating when the PLL is in a locked condition and a second state indicating when the PLL is in an unlocked condition. The phase differences and the selected number of cycles of the LOLD and GOLD may be programmed, as desired.

9 Claims, 6 Drawing Sheets

PHASE LOCKED LOOP LOCK DETECTOR INCLUDING LOSS OF LOCK AND GAIN OF LOCK DETECTORS

BACKGROUND OF THE INVENTION

The present invention relates to a phase locked loop using a digital phase comparator, and more particularly to a circuit for detecting the lock state of the phase locked loop.

U.S. Pat. No. 4,287,480 issued Sep. 1, 1981 to Swift et al for Phase Locked Loop Out-Of-Lock Detector discloses detection of the out-of-lock condition of a digital phase locked loop during a plurality of states such that single bit discrepancies are ignored. The disclosed phase locked loop detector includes a circuit in the feedback path to determine which mode of the phase locked loop feedback will be used to ignore single bit discrepancies.

U.S. Pat. No. 4,633,488 issued Dec. 30, 1986 to Shaw for Phase-Locked Loop for MFM Data Recording, and U.S. Pat. No. 4,745,372 issued May 17, 1988 for Phase-Locked-Loop Circuit Having a Charge Pump disclose phase locked loops having charge pumps and voltage controlled oscillators.

U.S. Pat. No. 4,929,916 issued May 29, 1990 to Fukuda for Circuit for Detecting a Lock of Phase Locked Loop discloses a circuit having a phase comparator receiving a first signal and a second signal for generating a phase difference signal, a waveform shaping circuit connected to receive the phase difference signal for generating an output signal when the phase difference signal indicates a phase difference exceeding a predetermined value, and a multi-stage counter having a frequency division function and having a reset input connected to receive the output signal of the waveform shaping circuit.

SUMMARY OF THE INVENTION

A lock detector is disclosed which is used to detect when a synthesized clock signal of a phase locked loop (PLL) has achieved a stable phase relationship with a reference signal. The PLL of the present invention includes an input for receiving the reference signal, a digital phase detector, a voltage controlled oscillator, and a frequency divider. The phase lock detector of the present invention includes a loss of lock detector (LOLD) connected to the frequency divider, and the phase detector. The LOLD detects the occurrence of a selected phase difference between the reference signal and an output of the frequency divider for a selected number of cycles. Also included is a gain of lock detector (GOLD) connected to the frequency divider and the input. The GOLD detects the occurrence of the reference signal within a selected phase difference of an output of the frequency divider for a second selected number of cycles. The output of the LOLD and the GOLD are connected to a latch for generating a composite signal responsive to signals generated by the LOLD and the GOLD such that the composite signal has a first state indicating when the PLL is in a locked condition and a second state indicating when the PLL is in an unlocked condition. The phase differences and the selected number of cycles of the LOLD and GOLD may be programmed, as desired.

It is an object of the present invention to provide a digital phase lock detector which looks for the occurrence of certain timing features from a reference signal within a phase window surrounding a phase position of a synthesized clock signal.

It is another object of the present invention to provide means for determining the phase position on the synthesized clock signal around which the phase window is centered.

It is another object of the present invention to provide means for determining the width of the phase window by the tolerance of deviation from a desired phase relationship.

It is another object of the present invention to provide means for programming both the phase relationship and the tolerance parameters.

It is another object of the present invention to provide means for opening and closing the phase window by generating high order harmonics of the synthesized clock signal and using timing features of those harmonics to establish a window covering certain degrees of phase angle before and after the established phase position.

It is another object of the present invention to provide a digital phase lock detector which operates on the principle that when two periodic signals are phase locked, the rising or falling edge of one signal always occurs having a certain phase relationship to the other signal.

It is another object of the present invention to provide a phase lock detector which indicates a lock condition when it consistently detects rising edges or falling edges, depending on the design of the lock detector, occurring around a desired phase angle of the synthesized signal.

It is another object of the present invention to provide a phase lock detector which can be programmed to look for the reference signal's edges at different phase angles of the synthesized signal. Once the desired phase angle has been entered, the phase lock detector looks for edges from the reference signal that fall within some plus-or-minus deviation from that desired phase angle to provide a window of tolerance which is also programmable.

The foregoing and other objects, features and advantages of the invention will be apparent from the following more particular description of the preferred embodiment of the invention as illustrated in the drawings.

DESCRIPTION OF THE PREFERRED EMBODIMENT

Figure 1:
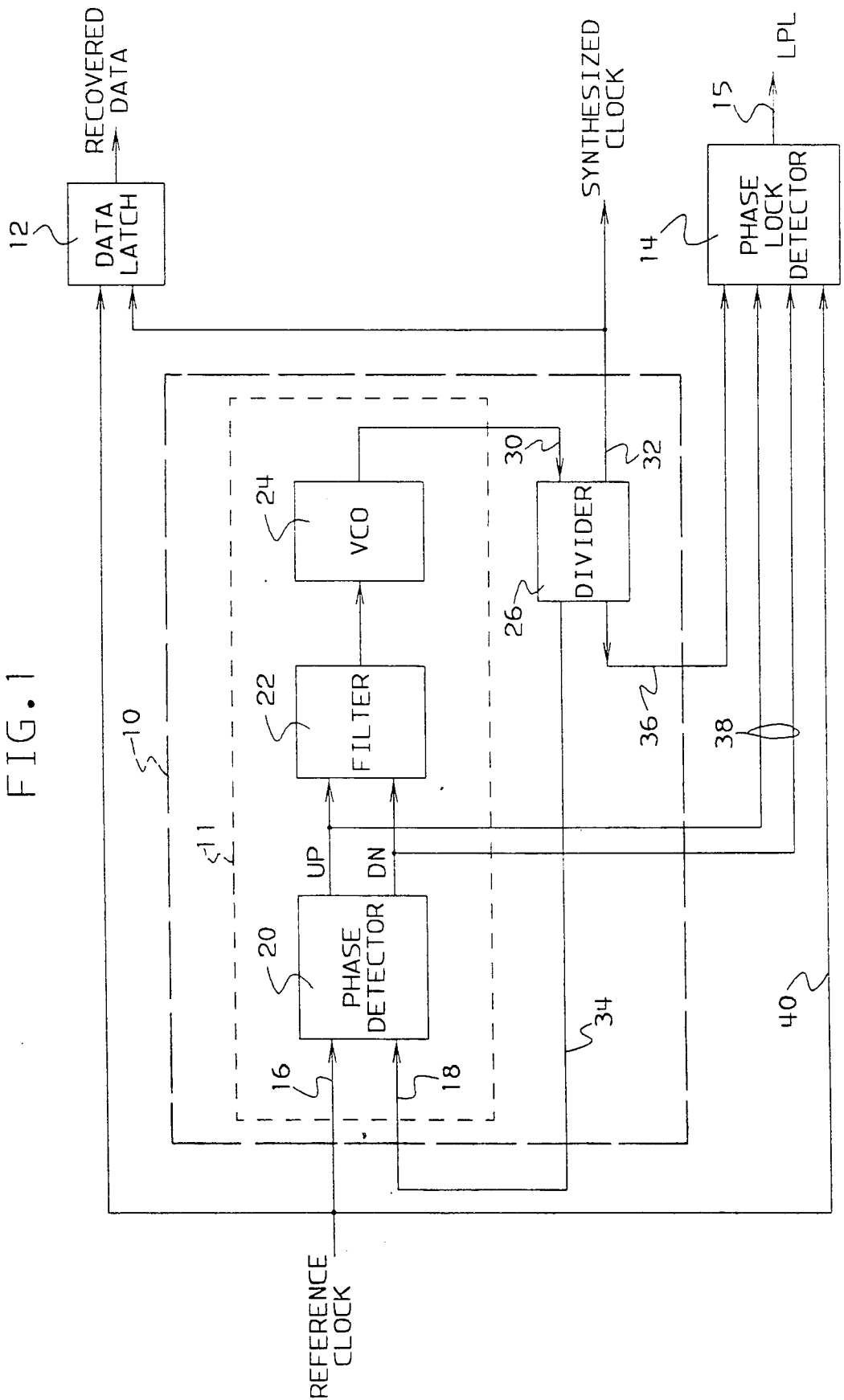
FIG. 1 is a block diagram of a phase locked loop (PLL) having a connected phase lock detector circuit.

FIG. 1 is a block diagram of a PLL 10 connected to a phase lock detector 14. The PLL 10 has a feed forward loop or portion 11 which includes a phase detector 20, a filter 22, and a voltage controlled oscillator (VCO) 24. The phase detector generates up (UP) and down (DN) signals which are used to charge or discharge a charge pump (not shown) in the filter 22 whose filtered output gives a voltage level to control the VCO 24. Such a scheme is well known in the PLL art, and will not be discussed further. It will also be understood that any PLL design in which the PLL is controlled digitally may be used with the present invention. The PLL 10 has an input 16 for receiving a reference signal, which may be a clock signal which oscillates at a given frequency or in accordance with a particular data pattern between prescribed voltage levels. The PLL 10 further includes a feedback portion which returns a signal from the VCO 24 to a feedback terminal 18 over conductors 30 and 34. A divider circuit 26 is included between the conductors 30 and 34 for providing multi-phase harmonics of a synthesized clock signal for use by the phase lock detector 14, as will be discussed. The output of the PLL 10 is the synthesized clock signal over conductor 32, which is a phase locked reproduction of the reference signal received at input 16. The reference signal is also inputted into the phase lock detector circuit 14 over conductor 40. UP and DN signals from the phase detector 20, which provide a measure of phase difference, are provided over conductors 38 to the phase lock detector 14, as will be discussed. Also, multi-phase harmonics from the divider 26 are provided over a group of conductors 36 to the phase lock detector 14. The output of the phase lock detector 14 is a loss of phase lock (LPL) signal which is provided over conductor 15.

In the disclosed embodiment, a data latch 12 is also provided, and receives the reference signal and the synthesized clock signal. The reference signal goes to the data terminal of a data latch 12, and the synthesized clock signal clocks the data latch 12 to provide a recovered data signal, as shown.

Figure 2:
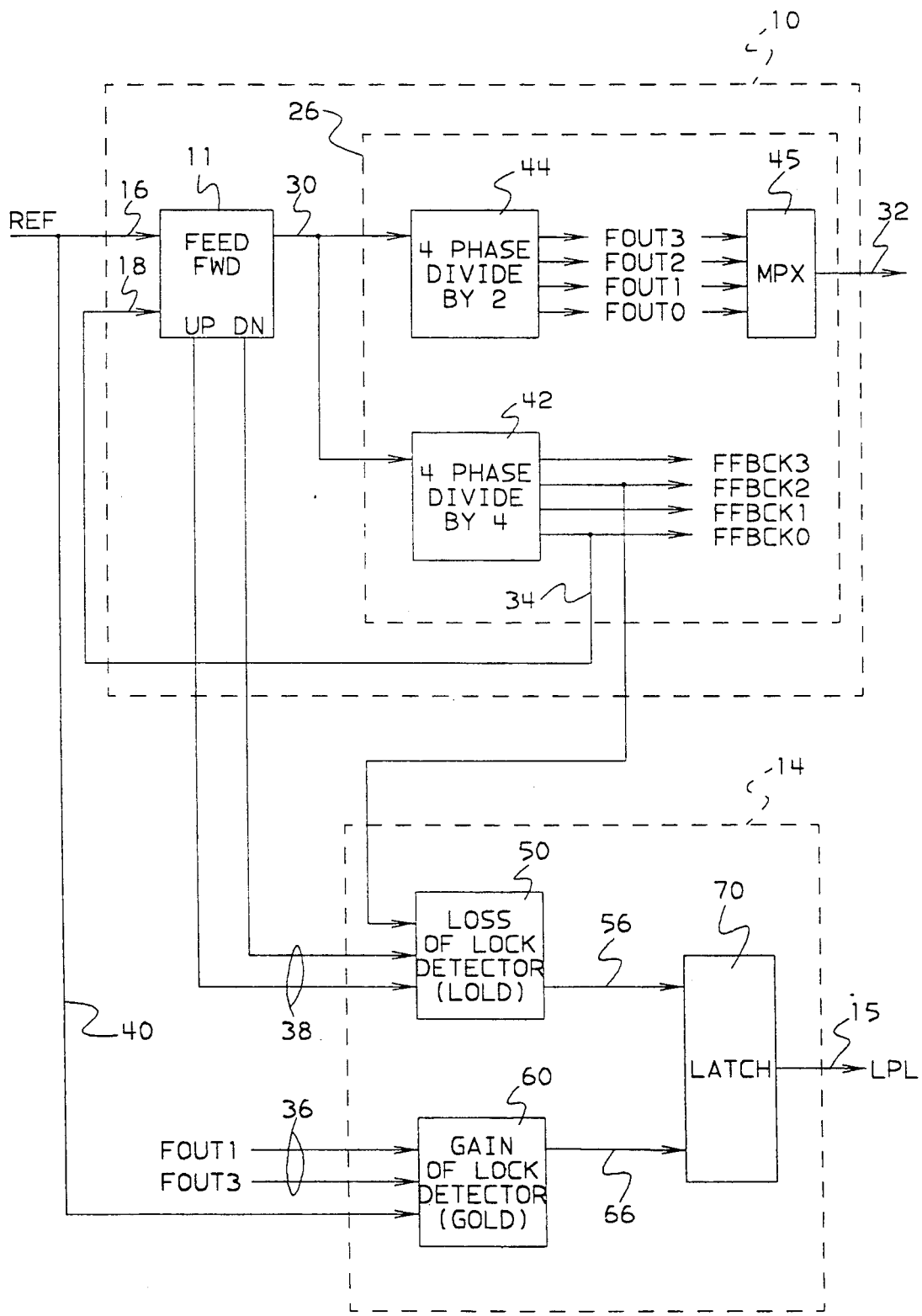
FIG. 2 is a block diagram of the device of FIG. 1 showing a divider circuit of the PLL and a loss of lock detector (LOLD), gain of lock detector (GOLD) and latch of the phase lock detector circuit of FIG. 1.

FIG. 2 is a block diagram showing components of the PLL 10 and the phase lock detector 14 of FIG. 1. The divider circuit 26 of the PLL 10 includes a four phase divide-by-four circuit 42 and a four phase divide-by-two circuit 44. The outputs of the divide-by-four circuit 42 provide 4 feed back signals labeled FFBCK0 through FFBCK3.

The outputs of the divide-by-two circuit 44 provide signals labeled FOUT0 through FOUT3. The FOUT0 through FOUT3 signals are inputted into a multiplexer 45, which is used to select which of the four signals are to be placed on conductor 32 for use as the synthesized clock signal of FIG. 1. In the present embodiment, the FFBCK0 signal is provided over conductor 34 to the feedback input 18 of the PLL 10, as previously described. The FOUT1, FOUT3, and FFBCK2 signals are provided to the phase lock detector 14. The phase lock detector 14 includes a loss-of-lock detector (LOLD) circuit 50, and a gain of lock detector (GOLD) circuit 60. The output of the LOLD 50 is provided over a conductor 56 to the set terminal of the latch 70, and the output of the GOLD 60 is provided over conductor 66 to the reset terminal of the latch 70. The output of the latch 70 provides the LPL signal, to be discussed further in connection with FIG. 10.

Figure 3:
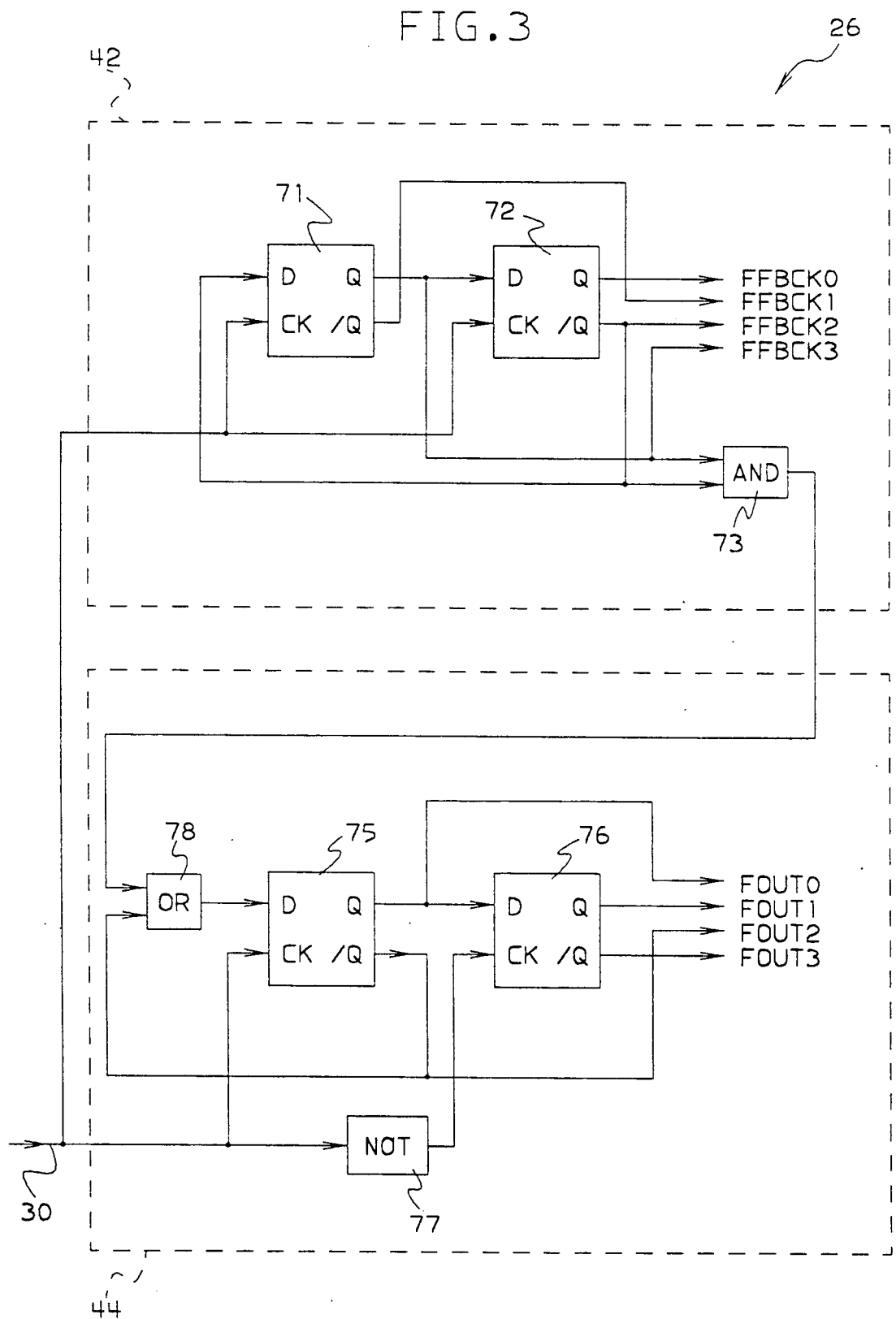
FIG. 3 is a logic circuit diagram of the frequency divider circuit of FIG. 2.

FIG. 3 is a logic circuit diagram of the frequency divider circuit 26 of FIG. 2, and includes the logic circuit diagrams of the divide-by-four circuit 42 and the divide-by-two circuit 44. It will be noted that, for convenience, the positions of the the circuits 42 and 44 have been reversed in FIG. 3 from that shown in FIG. 1. The divide-by-four circuit 42 includes a pair of D type flip-flops 71 and 72 which are clocked by the output 30 of the feed forward loop 11 (which output is hereinafter referred to as VCO). The /Q output of 72 provides the FFBCK2 signal and is connected to the D input of 71 and one input of an AND gate 73. The Q output of 71 is connected to the D input of 72, to the other input of AND gate 73, and provides the FFBCK3 signal. The Q output of 72 provides the FFBCK0 signal and the /Q output of 71 provides the FFBCK1 signal.

The divide-by-two circuit 44 has a pair of D type flip-flops 75 and 76. The flip-flop 75 is clocked by the VCO output signal on conductor 30, and 76 is clocked by the inverted VCO output with is inverted by the NOT function 77. One input of an OR gate 78 is connected to the output of the AND gate 73, and the other input of OR gate 78 is connected to the /Q output of 75 which also supplies the FOUT2 signal. The output of OR gate 78 is connected to the D input of 75, the Q output of 75 is connected to the D input of 76 and also supplies the FOUT0 signal. The Q output of 76 supplies the FOUT1 signal, and the /Q output of 76 supplies the FOUT3 signal.

Figure 4:
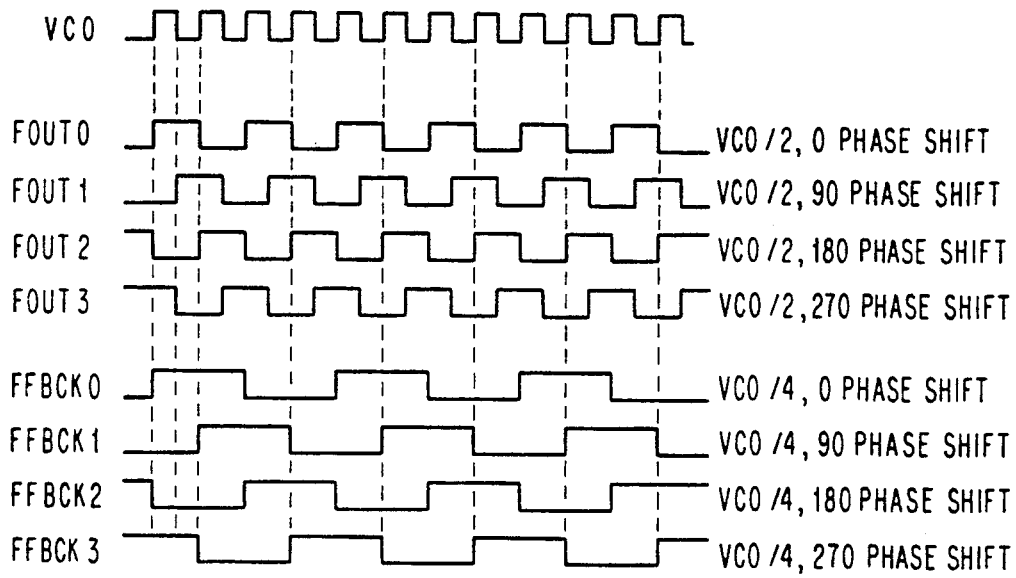
FIG. 4 is a timing diagram of signals from frequency divider circuit of FIG. 3.

The outputs of the divide-by-two circuit 44 are shown in FIG. 4 wherein FOUT0 is the VCO signal divided by 2 and having a zero degrees phase shift, FOUT1 is VCO divided by 2 and having a 90 degrees phase shift, FOUT2 is VCO divided by 2 and having a 180 degrees phase shift, and FOUT3 is VCO divided by 2 and having a 270 degrees phase shift. As will be explained, one of the FFBCK signals is selected to establish when a loss-of-lock occurs, and two of the FOUT signals are selected to define a window for use in establishing gain-of-lock. The output of the divide-by-four circuit 42 is shown in FIG. 4 wherein the FFBCK0 signal is the VCO signal divided by 4 and having zero degrees phase shift, the FFBCK1 signal is VCO divided by 4 and having a 90 degrees phase shift, the FFBCK2 signal is VCO divided by 4 and having a 180 degrees phase shift, and the FFBCK3 signal is VCO divided by 4 and having a 270 degrees phase shift.

Figure 5:
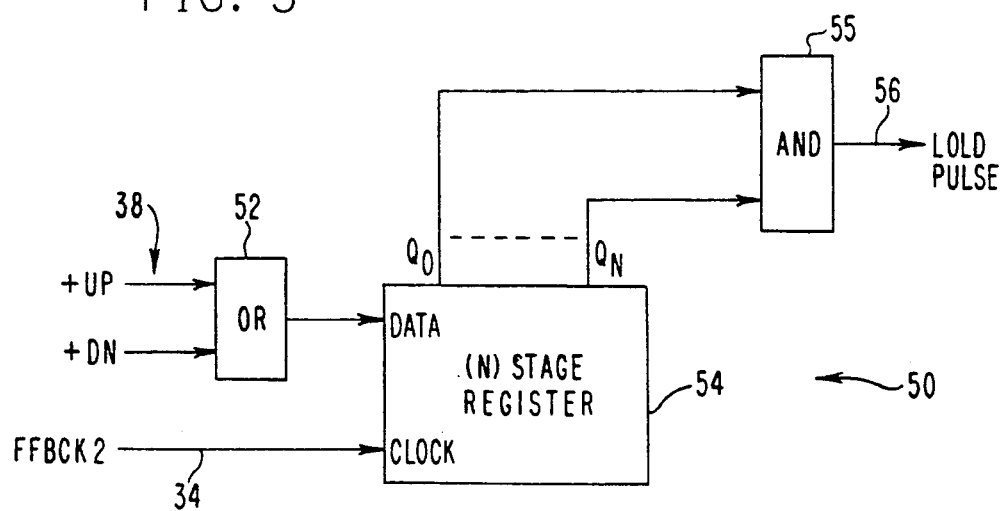
FIG. 5 is a logic circuit diagram of the LOLD of FIG. 2.
Figure 6:
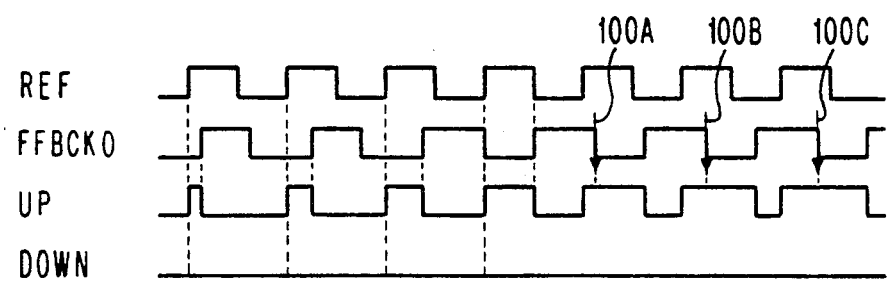
FIG. 6 is a timing diagram of the signals input into the LOLD showing the condition wherein the reference (REF) signal lags the feedback signal.

FIG. 5 is a logic circuit diagram of the LOLD 50. The UP and DN signals are provided to an OR gate 52 by the conductors 38. The output of OR gate 52 is connected to the data input of an N stage register 54 which is clocked by one of the FFBCK signals from the divide-by-four circuit 42, in the present embodiment the FFBCK2 signal. Selected ones of the outputs of the register 54 are connected to inputs of an AND gate 55 to program the LOLD 50 for different sensitivities. The AND gate 55 provides the output 56 of the LOLD 50 (see FIG. 2). FIG. 6 is a timing diagram showing the condition in which LOLD 50 indicates a loss of lock when the REF signal lags the FFBCK0 signal by 180 degrees or more for a set number of cycles. In the present embodiment, three stages of the register 54 are connected to the AND gate 55 so that the output on 56 will not be asserted high until three consecutive events have been detected. As shown in FIG. 6, an UP pulse is generated between the rising edge of the REF signal and the rising edge of the FFBCK0 signal as the PLL 10 tries to lock the synthesized clock with the reference clock. When the difference reaches 180 degrees, which is determined by selecting the FFBCK2 signal to clock register 54, the high of the UP signal is clocked into the first stage at 100A. At 100B the second high is clocked into 54, and at 100C the third high is clocked into 54. At this time, all three stages of 54 are high, and a high is asserted on 56 to indicate loss-of-lock. It will be understood that the number of occurrences can be changed by changing the number of stages of 54 connected to AND gate 55, and the degrees of difference to register an occurrence can be changed by selecting which of the FFBCK signals clocks the register 54.

Figure 7:
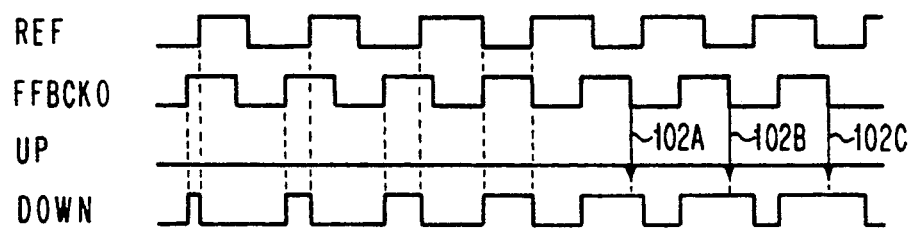
FIG. 7 is a timing diagram of the signals input into the LOLD showing the condition wherein the REF signal leads the feedback signal.

FIG. 7 is a timing diagram showing the detection of loss-of-lock when the REF signal leads the FFBCK0 signal for a selected number of cycles by 180 degrees or more. The PLL 10 generates a DN pulse between the rising edge of the FFBCK0 signal and the rising edge of the REF signal as it tries to lock the synthesized clock with the reference clock. When the difference reaches 180 degrees, the high of the DN signal is clocked into the first stage of the register 54 by the FFBCK2 signal, as shown at 102A. The second stage is clocked at 102B, and the third stage is clocked 102C, and the signal at 56 is then asserted high to indicate a loss of lock.

Figure 8:
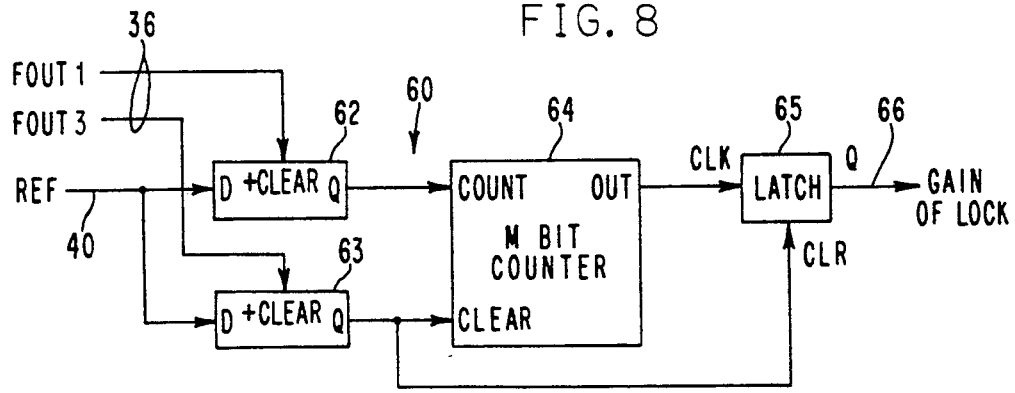
FIG. 8 is a logic circuit diagram of the GOLD of FIG. 2.
Figure 9:
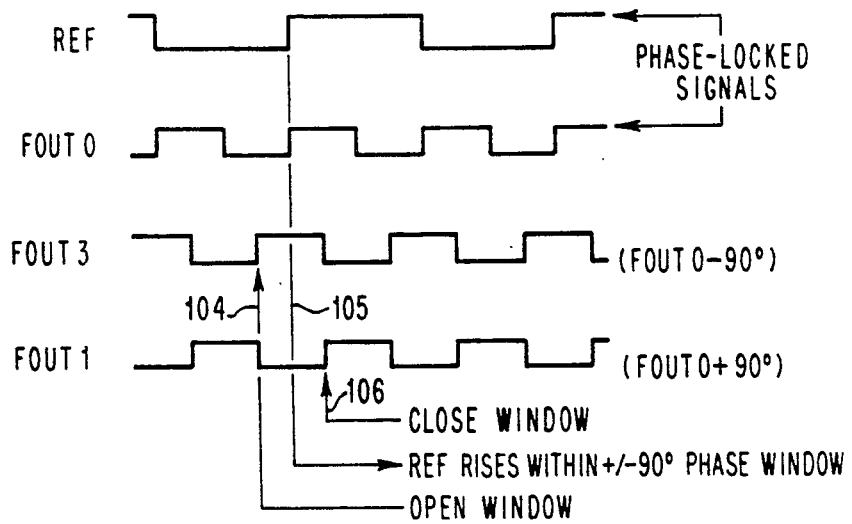
FIG. 9 is a timing diagram of signals input into the GOLD showing the phase window of the lock condition of the phase lock detector circuit.

FIG. 8 is a logic circuit diagram of the GOLD 60. The GOLD 60 looks for the occurrence of a certain timing feature from the reference clock signal within a phase window surrounding a phase position of the synthesized clock signal to determine if lock has been gained. The timing feature may be either a rising edge or a falling edge of the reference clock signal. If a phase difference of zero degrees is desired between the synthesized clock signal and the reference clock signal, the rising edge is used. If a phase difference of 180 degrees is desired between the synthesized clock signal and the reference clock signal, the falling edge is used. The chosen timing feature determines the phase position on the synthesized clock signal around which the phase window is centered. The width of the phase window is determined by the tolerance of the deviation from the desired phase relationship, as will be explained. In the GOLD 60 of FIG. 8, the REF signal is connected to the D inputs of a pair of D type flip-flops 62 and 63. The CLEAR terminal of 62 receives the FOUT1 signal to define the opening of a window, and the CLEAR terminal of 63 receives the FOUT3 signal to define the closing of the window. The Q output of 62 is connected to the count terminal of an M counter 64, and counter 64 and a latch 65 are cleared from the Q output of 63. The output of the counter 64 clocks the latch 65, and provides the gain-of-lock signal on the output 66 of the GOLD 60 (see FIG. 2). The GOLD 60 is programmed such that a set number of consecutive rising edges must be within the window before a gain-of-lock is indicated. This number is determined by the number of bits in the counter 64. In the present embodiment, the counter 64 is a 5 bit counter which counts to 32 such that M+1 is 33. Referring to FIG. 9, the rising edge of the REF signal is shown at 105 as occurring between the opening of the window at 104 by the FOUT1 signal, and the closing of the window at 106 by the FOUT3 signal. The FOUT0 signal is shown to illustrate the synthesized clock signal and to show, in the illustrated embodiment, the center of the window. It will be understood that the window is opened 90 degrees before the rising edge of FOUT0 by FOUT3, and is closed 90 degrees after the rising edge of FOUT0 by FOUT1. As long as the rising edge of REF occurs within + or − 90 degrees of the rising edge of FOUT0, a count will be recorded in the counter 64. It will be understood that the width of the window between 104 and 106 of FIG. 9 may be programmed by selection of the FOUT signals used for opening and closing the window. If M+1 consecutive rising edges of REF falls within the window, then the gain-of-lock signal on 66 is asserted high. The gain of lock signal on 66 is asserted low at the first single occurrence of a rising edge of REF falling outside of the window as determined by the Q output of 63.

Figure 10:
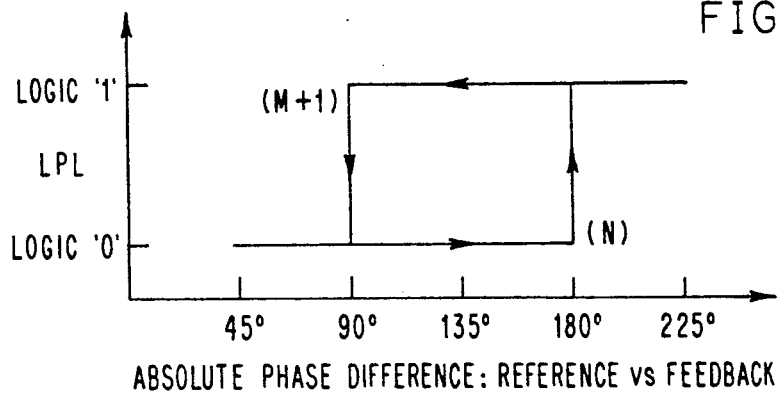
FIG. 10 is an illustration showing the hysteresis characteristics of a composite loss of phase lock (LPL) signal from the latch of FIG. 2.

Referring to FIG. 2, it will be seen that latch 70 is set by the LOLD 60 when REF either leads or lags FFBCK0 by 180 degrees for N consecutive cycles, and that the latch 70 is reset by the GOLD 60 when the rising edge of REF falls within the window for M+1 consecutive cycles. The resulting composite LPL signal is shown in FIG. 10. The LPL signal goes from logic 0 to logic 1 when the absolute phase difference between REF and the feedback signal FFBCK0 is over 180 degrees for N cycles, and goes from logic 1 to logic 0 when the absolute phase difference between REF and the feedback signal FOUT0 is within 90 degrees for M+1 cycles. Logic 0 indicates gain-of-lock, and logic 1 indicates loss-of-lock. FIG. 10 shows the hysteresis effect of the LOLD 50 and the GOLD 60.

While we have illustrated and described the preferred embodiment of our invention, it is to be understood that we do not limit ourselves to the precise construction herein disclosed, and the right is reserved to all changes and modifications coming within the scope of the invention as defined in the appended claims.

Having thus described our invention, what we claim as new, and desire to secure by Letters Patent is:

1. A circuit for detecting the lock state of a phase locked loop having an input for receiving a reference signal, an output for providing a synthesized clock signal having a specified phase relationship to said reference signal, said circuit comprising:

a frequency divider circuit for providing phase signals having selected phase differences with said synthesized clock signal;

loss of lock detector means having an output and being connected to said frequency divider circuit and said phase locked loop input, said loss of lock detector for detecting and indicating on its output, a loss of lock occurrence comprising said reference signal and said synthesized clock having a selected phase difference for a first selected number of cycles;

gain of lock detector means having an output and being connected to said frequency divider circuit and said phase locked loop input, said gain of lock detector for detecting and indicating on its output, a gain of lock occurrence comprising said reference signal being within a selected phased difference of said synthesized clock for a second selected number of cycles; and latch means connected to the outputs of said loss of lock detector means and said gain of lock detector means for generating a composite signal responsive to signals generated by said loss of lock detector means and said gain of lock detector means such that said composite signal has a first state indicating said phase locked loop is in a locked condition and a second state indicating said phase locked loop is in an unlocked condition.

2. The circuit of claim 1 further comprising a multiplexer connected to said frequency divider circuit for selecting one of said phase signals as said synthesized clock signal.

3. The circuit of claim 2 wherein said loss of lock detector means includes phase difference means for selecting the phase difference between said reference signal and said synthesized clock signal in the detection of said loss of lock occurrence.

4. The circuit of claim 3 wherein said loss of lock detector means includes sensitivity means for selecting the number of said first number of cycles in the detection of said loss of lock occurrence.

5. The circuit of claim 4 wherein said phase lock loop has a phase detector having a first output for providing a first signal when said reference signal leads said synthesized signal and second output for providing a second signal when said reference signal lags said synthesized signal; and said loss of lock detector means comprising:
an OR gate having a first input connected to the first output of said phase detector, a second input connected to the second output of said phase detector, and an output; an N stage register having a data input connected to the output of said OR gate, a clock input for receiving a selected one of said phase signals from said frequency divider circuit, and a plurality of Q outputs, one Q output for each stage of said N stage register; and an AND gate having a plurality of inputs, each input of said AND gate being connected to one of the Q outputs of said N stage register, and an output forming the output of said loss of lock detector for indicating said loss of lock occurrence.

6. The circuit of claim 5 wherein said gain of lock detector means includes a window means for defining a window which said reference signal must be in for said gain of lock to detected.

7. The circuit of claim 6 wherein said gain of lock detector has a first input for receiving a first one of said phase signals to define the opening of said window, and a second input for receiving a second one of said phase signals to define the closing of said window.

8. The circuit of claim 7 wherein said gain of lock detector comprises:
a first two-state device having a data input for receiving said reference signal, a clear input for receiving said first one of said phase signals, and an output for providing a signal upon said reference signal going to a logic 1 after said window is opened by said first phase signal;

a second two-state device having a data input for receiving said reference signal, a clear input for receiving said second one of said phase signals, and an output for providing a clear signal upon said reference signal going to a logic 1 after said window is closed by said second phase signal;

an M counter having a count input connected to the output of said first two-state device for counting occurrences of said reference signal going to a logic 1 during said window, a clear terminal connected to the output of said second two-state device for clearing said M counter when said reference signal goes to a logic 1 outside the window defined by said window means, and an output terminal for providing a logic 1 after M+1 consecutive counts by said M counter; and a latch having an input connected to the output terminal of said M counter, a clear terminal connected to the output of said second two-state device, and an output forming the output of said gain of lock detector, said latch for storing a logic 1 from said M counter after M+1 occurrences of said reference signal going to a logic 1 between the opening and closing of said window, and for clearing the latch to a logic 0 upon a single occurrence of said reference signal going to a logic 1 outside the window defined by said window means.

9. The circuit of claim 8 wherein said composite signal goes from said first state to said second state after N consecutive occurrences of the phase difference between said reference signal and said synthesized clock signal being greater than the selected phase difference as determined by said selected one of said phase signals received by the clock input of said N stage register, and said composite signal goes from said second state to said first state after the M+1 said reference going to said logic 1 during said window as determined by said first and second phase signals being connected to the clear inputs of said first and second two-state devices, respectively.

* * * * *